US008680937B2

(12) United States Patent
Chang

(10) Patent No.: US 8,680,937 B2
(45) Date of Patent: Mar. 25, 2014

(54) DIFFERENTIAL EQUALIZERS WITH SOURCE DEGENERATION AND FEEDBACK CIRCUITS

(75) Inventor: Yi-Cheng Chang, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 781 days.

(21) Appl. No.: 12/948,447

(22) Filed: Nov. 17, 2010

(65) Prior Publication Data

US 2012/0121004 A1    May 17, 2012

(51) Int. Cl.
*H04B 3/14* (2006.01)
*H04L 25/03* (2006.01)

(52) U.S. Cl.
USPC .......................................... 333/28 R; 333/18

(58) Field of Classification Search
USPC .................................................. 333/18, 28 R
See application file for complete search history.

(56) References Cited

U.S. PATENT DOCUMENTS

| | | | | |
|---|---|---|---|---|
| 4,122,299 | A * | 10/1978 | Cannon | 341/138 |
| 6,917,257 | B2 * | 7/2005 | Gondi | 333/28 R |
| 7,230,989 | B2 * | 6/2007 | Biman et al. | 375/259 |
| 7,508,892 | B2 | 3/2009 | Kibune et al. | |
| 7,562,108 | B2 | 7/2009 | Singh et al. | |
| 7,583,146 | B2 | 9/2009 | Tam et al. | |
| 7,656,939 | B2 | 2/2010 | Gondi et al. | |
| 7,692,495 | B2 | 4/2010 | Uehara et al. | |
| 2007/0047636 | A1 * | 3/2007 | Lim et al. | 375/229 |

OTHER PUBLICATIONS

EPC Application No. 11189027, "Differential Equalizers With Source Degeneration and Feedback Circuits", Inventor Yi Cheng Chang, Filed Nov. 17, 2010, Extended Search Report mailed Mar. 16, 2012.
Choi, J., et al., "A 0.18-m CMOS 3.5-Gb/s Continuous-Time Adaptive Cable Equalizer Using Enhanced Low-Frequency Gain Control Method", IEEE JSSC, vol. 39, No. 3, Mar. 2004.
Tomita, Y., et al., "A 10-Gb/s Receiver with Series Equalizer and On-Chip ISI Monitor in 0.11-um CMOS", IEEE JSSC, vol. 40, No. 4, Apr. 2005.
Holdenreid, C., et al., Modified CMOS Cherry-Hopper Amplifiers with Source Follower Feedback in 0.35 um Technology, IEEE Apr. 2003.
Higashi, H., et al., A 5-6.4-Gb/s 12 Channel Transreceiver with Pre-Emphasis and Equalization, IEEE JSSC, vol. 40, No. 4, Apr. 2005.

* cited by examiner

*Primary Examiner* — Dean O Takaoka
*Assistant Examiner* — Alan Wong
(74) *Attorney, Agent, or Firm* — Sherry W. Schumm

(57) ABSTRACT

An embodiment of an equalizer includes a voltage-to-current converter and a current-to-voltage converter. The voltage-to-current converter is configured to convert a differential input voltage to a differential current, and includes a differential amplifier with a first transistor and a second transistor, and a first source degeneration circuit coupled between the first transistor and the second transistor. An embodiment of the first source degeneration circuit includes a first resonant circuit. The current-to-voltage converter is coupled to the voltage-to-current converter, and is configured to convert the differential current to a differential output voltage. The current-to-voltage converter includes a first inverter with a first feedback circuit and a second inverter coupled to the first inverter, which includes a second feedback circuit. An embodiment of the first feedback circuit includes a second resonant circuit, and an embodiment of the second feedback circuit includes a third resonant circuit.

22 Claims, 4 Drawing Sheets

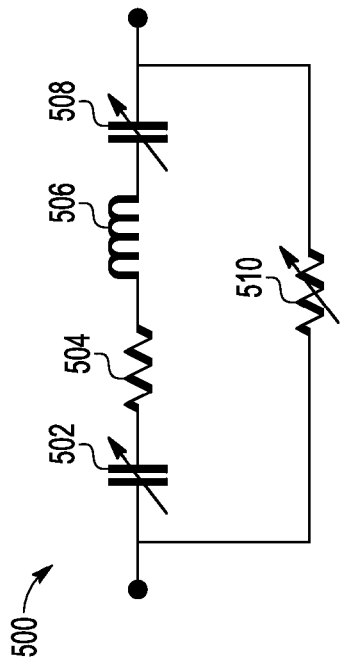
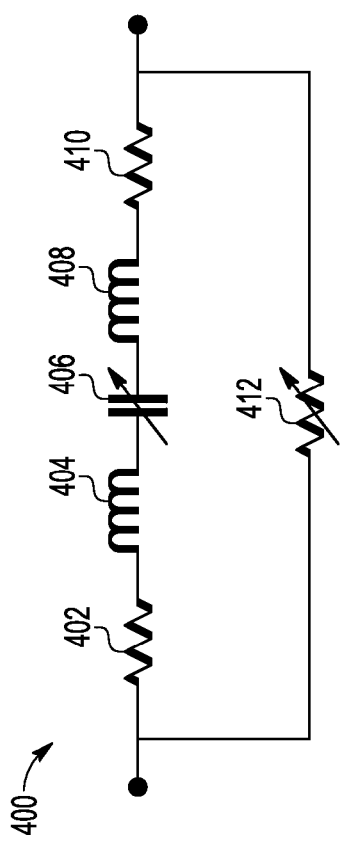
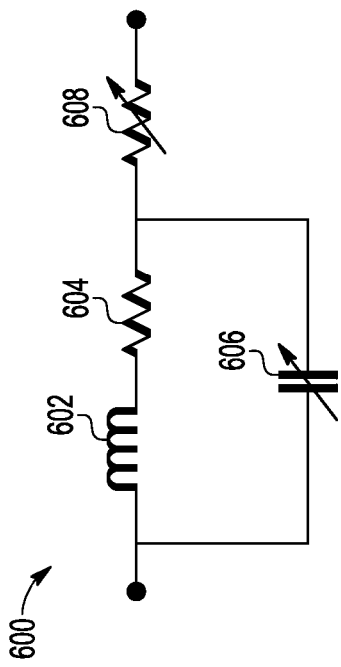
FIG. 5
FIG. 4
FIG. 6

DIFFERENTIAL EQUALIZERS WITH SOURCE DEGENERATION AND FEEDBACK CIRCUITS

TECHNICAL FIELD

Embodiments relate to differential equalizers for wireline communications, and more particularly to differential equalizers that include source degeneration circuits and feedback circuits.

BACKGROUND

In wireline communications, a received signal may be distorted due to intersymbol interference (ISI) from the signal channels. ISI results from dielectric losses and frequency-dependent signal losses (due to the skin effect) that occur along the transmission medium (e.g., printed circuit board (PCB) microstrips, cables, coaxial connecters, and so on). ISI typically causes significant eye jitter, which makes it more difficult for a receiver to synchronize in a manner that results in reliable clock and data recovery.

In some wireline receivers, adaptive equalization circuits (or "equalizers") are implemented to compensate for ISI. An equalizer receives an ISI-distorted signal from the transmission medium, and attempts to compensate for losses over the signal bandwidth, in order to reduce the eye jitter to an acceptable level. More particularly, an equalizer has a gain-versus-frequency transfer function which, ideally, is an inverse of the gain (loss)-versus-frequency characteristic of the signal channel. Accordingly, the equalizer may compensate for the loss imparted by the signal channel by applying appropriate gains to the received signal across the signal bandwidth. Because the loss characteristics of a channel tend to increase as the transmission frequency increases, a well designed equalizer should have higher gain-versus-frequency slope characteristics at higher frequencies.

Although traditional equalizers designed for lower-frequency transmissions have adequately compensated for ISI at those lower frequencies, these equalizers were not designed to perform robustly for the higher frequency communications that are becoming increasingly more prevalent and desired. Accordingly, most traditional equalizers are not capable of adequately compensating for higher ISI inherent in increasingly higher frequency communications.

Some more contemporary equalizer designs have attempted to tackle ISI issues inherent in higher-frequency communications. For example, some newer equalizers include multiple branches of cascaded "differentiator circuits" to composite an equalizer. However, the capacitive parasitic of the multi-parallel stages limits the high-speed capacity. In addition, these equalizers typically use many gain stages, which significantly increase a receiver's power consumption, particularly at high frequencies. Other undesirable effects also may be inherent in some new equalizer designs (e.g., inadequate or inconsistent gain over the bandwidth of interest, sensitive AC gain response, frequency limitations, and so on). Accordingly, designers continue to strive to develop relatively low-power, adaptive equalization circuits that can provide adequate ISI compensation at increasingly higher transmission frequencies.

BRIEF DESCRIPTION OF THE DRAWINGS

FIG. 4 illustrates a simplified, circuit diagram of a source degeneration impedance circuit, according to an example embodiment;

FIG. 5 illustrates a simplified, circuit diagram of a source degeneration impedance circuit, according to another example embodiment;

FIG. 6 illustrates a simplified, circuit diagram of a feedback impedance circuit, according to an example embodiment;

DETAILED DESCRIPTION

Embodiments include equalizers with resonant circuits that enable the gain-frequency response of the equalizers to be tailored to more effectively compensate for intersymbol interference (ISI) over a bandwidth of interest. An embodiment of a primary equalizer stage includes a voltage-to-current converter coupled in series with a current-to-voltage converter. The voltage-to-current converter converts a differential input voltage to a differential current, and includes a differential amplifier and a source degeneration circuit. As will be described in more detail below, the source degeneration circuit includes a resonant circuit that affects the gain-frequency response of the equalizer, in an embodiment. The current-to-voltage converter converts the differential current produced by the voltage-to-current converter to a differential output voltage. The current-to-voltage converter includes a pair of coupled inverters, each with a feedback circuit, and is current-biased with a current sink for differential operations. As will also be described in more detail below, each feedback circuit also includes a resonant circuit that further affects the gain-frequency response of the equalizer, in an embodiment. In alternate embodiments, the resonant circuits of either the source degeneration circuit or the feedback circuits may be replaced by non-resonant circuits. A further embodiment of an equalizer includes a secondary equalizer coupled in series with the primary equalizer, where the secondary equalizer functions as a swappable equalizer/limiter.

Various embodiments of source degeneration circuits and feedback circuits are discussed below. In some of the below discussed embodiments, the source degeneration circuits and/or feedback circuits are described to include "resistors," "capacitors," and "inductors." It is to be understood that any reference to a "resistor," "capacitor" or "inductor" in the description or claims should be interpreted to mean either a discrete component (e.g., a single resistor, capacitor or inductor) or a circuit or network that includes multiple interconnected components of a particular type (e.g., a resistor circuit, capacitor circuit or inductor circuit). Similarly, references to a "resistor circuit," a "capacitor circuit" or an "inductor circuit" in the description or claims may be interpreted to mean multiple interconnected components of a particular type or a single discrete component.

Figure 1:
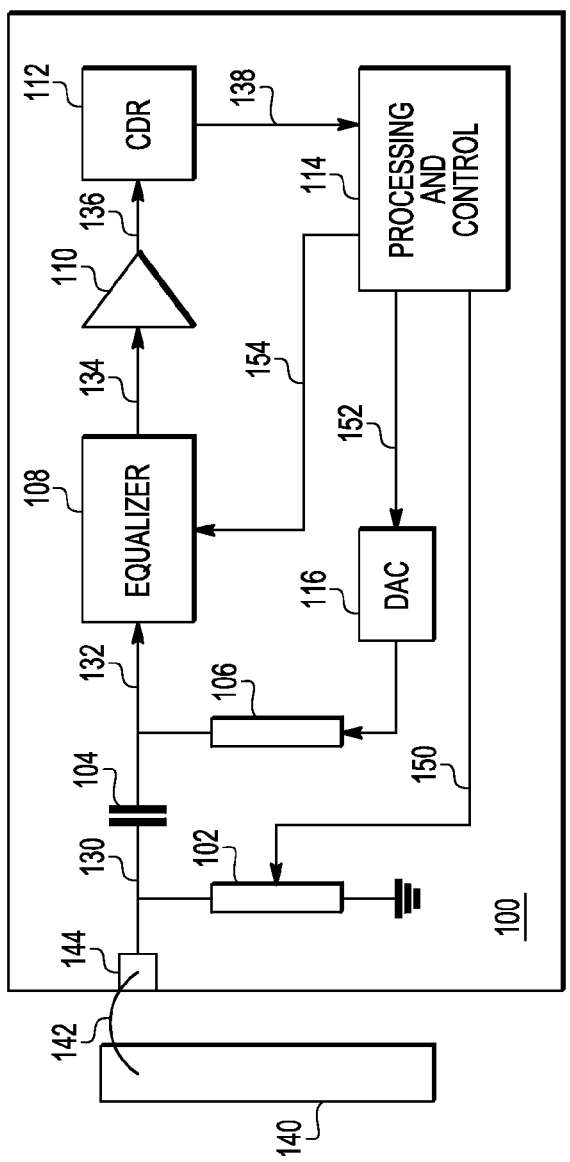
FIG. 1 illustrates a simplified block diagram of a portion of a wireline receiver, according to an example embodiment.

FIG. 1 illustrates a simplified block diagram of a portion of a wireline receiver 100, according to an example embodiment. Receiver 100 includes variable impedance circuit 102, AC coupling capacitor 104, bias circuit 106, equalizer 108, buffer 110, clock and data recovery (CDR) circuit 112, and processing and control circuit 114. Receiver 100 receives an input signal 130 from an input transmission medium, which may include, for example, a printed circuit board (PCB) microstrip 140, wirebond 142, bond pad 144, and/or additional or different conductive structures (not illustrated) that comprise a wired transmission medium. Although input signal 130 and other subsequently described data-bearing signals (e.g., signals 132, 134, 136, 138) are drawn single ended, it is to be understood that these signals actually are differential signals, according to an embodiment.

Variable impedance circuit 102 is configured to reduce reflections of the input signal 130 due to impedance mismatches between the input transmission medium and components at the input of receiver 100. The impedance of variable impedance circuit 102 may be adaptively adjusted through alteration of values of variable components within variable impedance circuit 102, where the adjustments may be conveyed in control signals 150 provided by processing and control circuit 114. Processing and control circuit 114 may calculate the adjustments based on analyses of feedback signals (e.g., signals 138 provided by CDR circuit 112).

AC coupling capacitor 104 receives the input signal 130, and is configured to high pass filter the input signal in order to reduce out-of-band signal and noise components. An input bias is applied to the resulting, filtered input signal 132 by bias circuit 106, in order to minimize the input referred offset. The applied bias also may be controlled by processing and control circuit 114, through a control signal 152 that may be converted to an opposite magnitude of the input referred offset voltage at the equalizer input port by the digital-to-analog converter (DAC) 116 and bias circuit 106.

According to an embodiment, the filtered input signal 132 is a coded signal (e.g., an 8 bit/10 bit coded signal). Equalizer 108 receives signal 132, and applies a transfer function to the signal 132 in order to adaptively compensate for signal losses imparted on the signal 132 by the transmission medium. As will be described in more detail below, embodiments of equalizer 108 are designed to more effectively compensate for intersymbol interference (ISI) than traditional equalizers, particularly at relatively high frequencies (e.g., frequencies up to and exceeding 5 gigahertz), thus enabling eye jitter to be reduced to levels that result in robust data detection by CDR circuit 112. Variable resistors (e.g., resistor circuits) and variable capacitors (e.g., varactors or capacitor circuits) within equalizer 108, which affect the equalizer gain-frequency response, may be adjusted by equalizer control signals 154 provided by processing and control circuit 114, as will be described in more detail later. The configuration and controllability of equalizer 108 enables a reduction in the eye jitter of the filtered input signal 132 to a level that enables CDR circuit 112 to perform its operations robustly.

Voltage buffer 110 comprises a unity-gain buffer amplifier, which substantially eliminates loading effects that may be present between the circuits. CDR circuit 112 receives the post-voltage-buffer, equalized signal 136, and generates a local clock from an approximate frequency reference, which is substantially phase-aligned with transitions in the data stream represented in equalized signal 136. The phase-aligned clock, in turn, is used to make a correct data decision on the received, equalized signal 136, in order to produce a phase-aligned signal 138.

Processing and control circuit 114 receives the phase-aligned signal 138, and is configured to detect the crossing point for each signal pulse (e.g., to detect the signal at the bit-cell boundaries). More particularly, periodically and within a certain time frame from receiving a portion of the phase-aligned signal 138, processing and control circuit 114 analyzes the pulse-edge distribution of the phase-aligned signal 138, where a "pulse-edge" may correspond to a rising or falling edge. In the context of that analysis, processing and control circuit 114 determines the nominal zero-crossing locations of pulses that contain different numbers of bits (e.g., pulse widths of 1-bit, 2-bits, . . . 5-bits, and so on). During subsequent comparing operations, processing and control circuit 114 determines whether the zero-crossing locations among the various bit pulses indicate whether the equalizer is being operated at over or under equalization conditions. Via control signal 154, processing and control circuit 114 may then adjust various component values within equalizer 108, which bring the equalizer conditions within a more optimal range. According to an embodiment and as will be discussed in more detail later, decoder logic circuitry (not illustrated) may be employed to control various tunable resistors and/or capacitors of equalizer 108, in order to adjust the high-frequency gain response.

Figure 2:
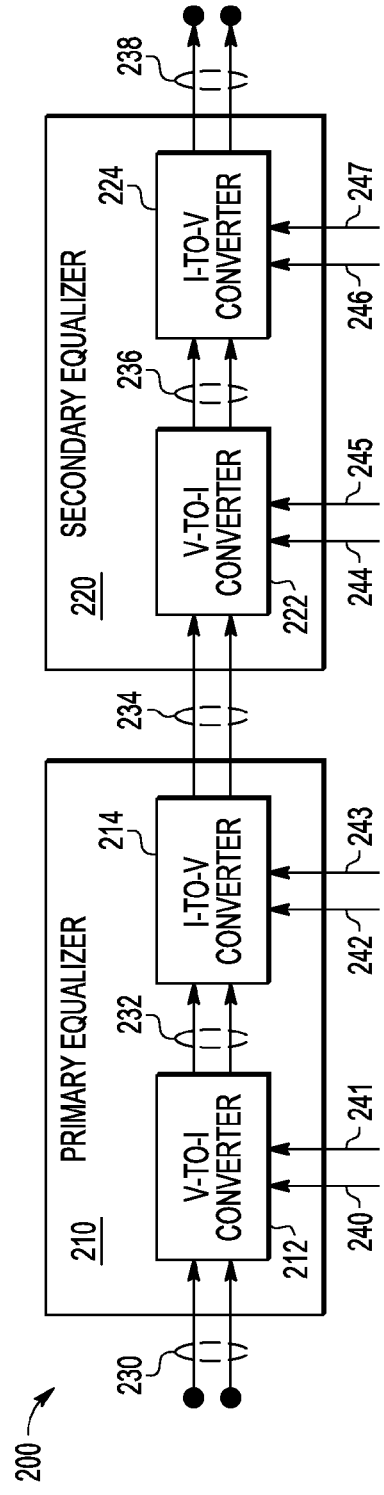
FIG. 2 illustrates a simplified block diagram of an equalizer consisting of series-connected, primary and secondary equalizers, according to an example embodiment.

FIG. 2 illustrates a simplified block diagram of an equalizer 200 (e.g., equalizer 108, FIG. 1), which includes series-connected, primary and secondary equalizer stages 210, 220, according to an example embodiment. Primary equalizer stage 210 is configured to provide the primary equalization for the equalizer 200, and secondary equalizer stage 220 is configured to function as a swappable equalizer/limiter, which enhances the subsequent equalization gain and/or functions as a limiter, when appropriate.

Primary equalizer stage 210 includes a first voltage-to-current (V-to-I) converter 212 coupled with a first current-to-voltage (I-to-V) converter 214. The first V-to-I converter 212 receives a differential input voltage signal 230 (e.g., signal 132, FIG. 1), and converts it into a differential current signal 232. As will be described in more detail in conjunction with FIG. 3, first V-to-I converter 212 includes a differential amplifier with source degeneration impedance, where the source degeneration impedance is provided with a source degeneration impedance circuit (e.g., circuit 320, FIG. 3). The source degeneration impedance circuit may include a variable resistor (e.g., a resistor circuit) in parallel with a series inductor-capacitor (LC) circuit, where the series LC circuit includes one or more inductors in series with one or more variable capacitors (e.g., varactors or capacitor circuits), in an embodiment. The resistance of the source degeneration impedance circuit may be varied based on a resistance control signal 241 provided by a control component of the system (e.g., equalizer control signal 154 provided by processing and control circuit 114, FIG. 1), in order to adjust the signal gain applied by primary equalizer 210. In addition, the capacitance of the variable capacitors may be varied based on a capacitance control signal 240 provided by a control component of the system (e.g., equalizer control signal 154 provided by processing and control circuit 114, FIG. 1), in order to affect the frequency response of the V-to-I converter 212.

The first I-to-V converter 214 receives the differential current signal 232 produced by the first V-to-I converter 212, and converts it into a differential voltage signal 234. As will be also described in more detail in conjunction with FIG. 3, first I-to-V converter 214 includes a pair of inverters (e.g., CMOS inverters comprising transistors 356, 358, 360, 362, FIG. 3), feedback impedance circuits (e.g., feedback impedance circuits 364, 366, FIG. 3), and a tail current sink (e.g., tail current sink 374, FIG. 3) to support differential operations for the pair of inverters and the feedback impedance circuits, in an embodiment. The resistances of the feedback impedance circuits may be varied based on a resistance control signal 242 provided by a control component of the system (e.g., equalizer control signal 154 provided by processing and control circuit 114, FIG. 1), in order to adjust the signal gain applied by primary equalizer 210. In addition, in embodiments in which the feedback impedance circuits include variable capacitors, the capacitances of the variable capacitors may be varied based on a capacitance control signal 243 provided by the control component of the system.

As mentioned above, secondary equalizer stage 220 may function as a swappable equalizer/limiter. This means that secondary equalizer stage 220 may either enhance the signal gain further in the selected high-frequency band (e.g., when the voltage signal 234 produced by the primary equalizer stage 210 has insufficiently steep pulse-edge slopes at its waveform or has a lower magnitude of high-frequency spectrum in the frequency domain, which indicates a condition of under-equalization), or may function as a limiter circuit that clips the signal (e.g., when the voltage signal 234 produced by the primary equalizer stage 210 has sufficiently steep pulse-edge slopes at its waveform or a sufficiently large magnitude of high-frequency spectrum in the frequency domain, which indicates a condition of over-equalization). As mentioned previously, processing and control circuit 114 evaluates the conditions indicated by phase-aligned signal 138 to determine whether equalizer 108 is providing over- or under-equalization, and based on that determination, the processing and control circuit 114 may cause the functional modes of secondary equalizer stage 220 to swap between either an extended equalizer stage (when a condition of under-equalization is detected) or a limiter circuit (when a condition of over-equalization is detected).

Secondary equalizer stage 220 is coupled in series with the output of the primary equalizer stage 210, and includes a second V-to-I converter 222 and a second I-to-V converter 224. The second V-to-I converter 222 receives the differential voltage signal 234, and converts it into a differential current signal 236. The second V-to-I converter 222 may be configured substantially the same as or differently from the first V-to-I converter 212. In an embodiment, the second V-to-I converter 222 is similar to the first V-to-I converter 212, in that the second V-to-I converter 222 also includes a differential amplifier and a source degeneration impedance circuit with a variable resistor in parallel with one or more variable capacitors. However, the source degeneration impedance circuit of the second V-to-I converter 222 may or may not include one or more inductors in series with the one or more variable capacitors. Either way, the capacitance of the variable capacitor(s) may be varied based on a capacitance control signal 244 provided by a control component of the system (e.g., equalizer control signal 154 provided by processing and control circuit 114, FIG. 1), in order to affect the frequency response of the V-to-I converter 222. In addition, in an embodiment, the resistance of the source degeneration impedance circuit may be varied based on a resistance control signal 245 provided by a control component of the system (e.g., equalizer control signal 154 provided by processing and control circuit 114, FIG. 1), in order to adjust the signal gain applied by secondary equalizer 220.

The second I-to-V converter 224 receives the differential current signal 236 produced by the second V-to-I converter 222, and converts it into a differential output voltage signal 238. Differential output voltage signal 238 corresponds to the output signal of the equalizer 200 (e.g., equalized signal 134, FIG. 1), in an embodiment. The second I-to-V converter 224 may be configured substantially the same as or differently from the first I-to-V converter 214. In an embodiment, the second I-to-V converter 224 also includes a pair of inverters (e.g., CMOS inverters) and either feedback resistor circuits or feedback impedance circuits (referred to generally as "feedback circuits"). In the former embodiment, the resistances of the feedback resistor circuits may be varied based on a resistance control signal 246 provided by a control component of the system (e.g., equalizer control signal 154 provided by processing and control circuit 114, FIG. 1), in order to adjust the signal gain applied by secondary equalizer 220. In addition, in embodiments in which feedback impedance circuits with variable capacitors are implemented in the second I-to-V converter 224, the capacitances of the variable capacitors may be varied based on a capacitance control signal 247 provided by the control component of the system. The second I-to-V converter 224 also may include a tail current sink (e.g., tail current sink 374, FIG. 3) to support differential operations for the pair of inverters and the feedback circuits.

Figure 3:
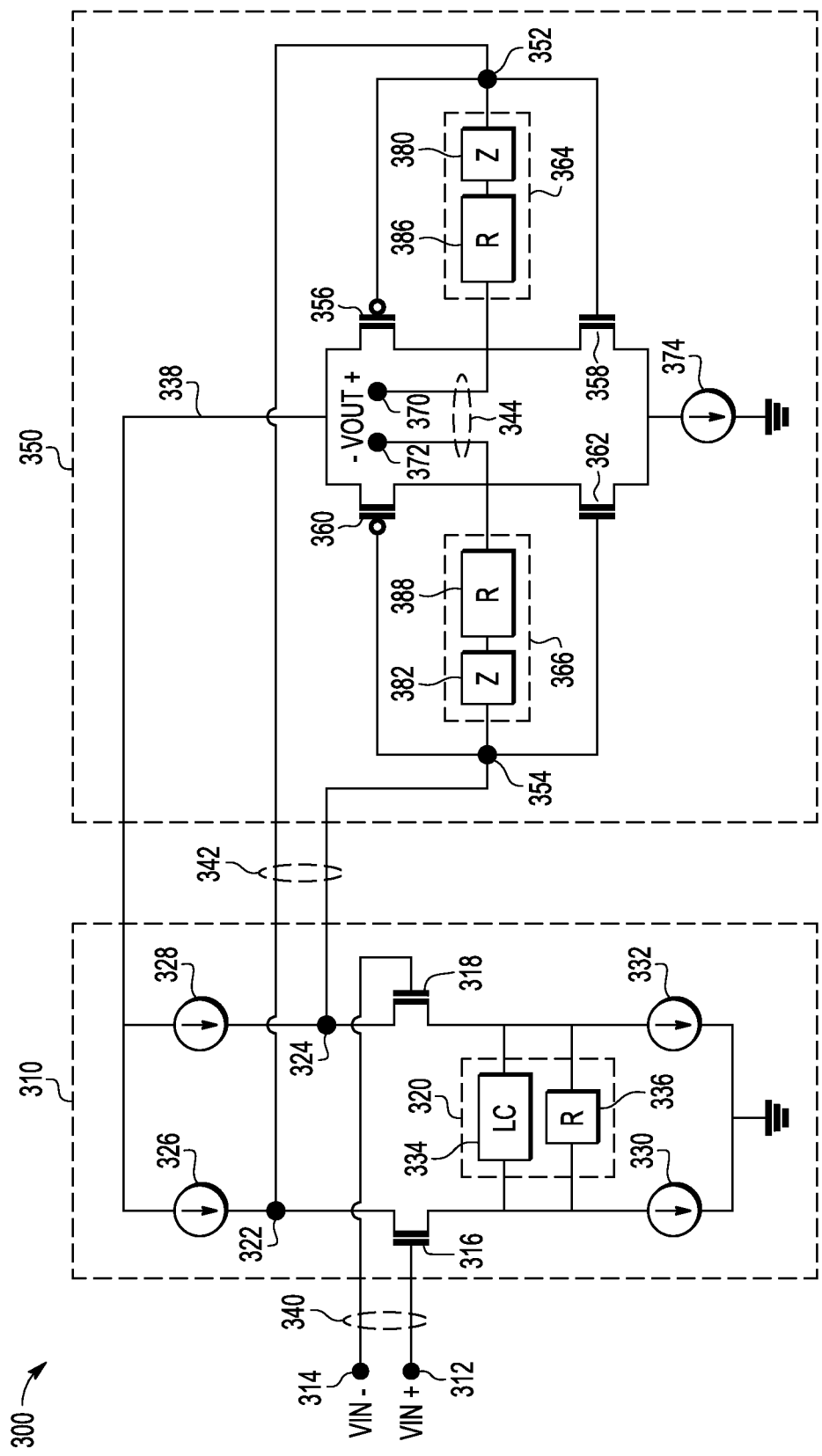
FIG. 3 illustrates a circuit diagram of a primary equalizer, according to an example embodiment.

FIG. 3 illustrates a circuit diagram of a primary equalizer 300 (e.g., primary equalizer 210, FIG. 2), according to an example embodiment. Primary equalizer 300 includes a V-to-I converter 310 (e.g., V-to-I converter 212, FIG. 2) connected in series with an I-to-V converter 350 (e.g., I-to-V converter 214, FIG. 2). As discussed previously, V-to-I converter 310 is configured to convert a differential input voltage signal 340 (e.g., signal 132, FIG. 1 or 230, FIG. 2) into a differential current signal 342 (e.g., signal 232, FIG. 2). V-to-I converter 310 includes a non-inverting input 312, an inverting input 314, a differential amplifier circuit comprised of at least a pair of transistors 316, 318, a source degeneration impedance circuit 320, an inverting output 322, a non-inverting output 324, a first current source 326, a second current source 328, a first current sink 330, and a second current sink 332, in an embodiment. First current sink 330 and second current sink 332 draw power from source voltage 338 (e.g., Vdd). In an embodiment, p-type current sources may be used for the first and second current sources 326, 328, which may increase the headroom of the equalizer 300. In an alternate embodiment, the first current source 326 and the second current source 328 may be replaced with a current mirror circuit (e.g., current mirror circuit 402, FIG. 4).

The transistors 316, 318 of the differential amplifier sub-circuit are coupled between the non-inverting input 312, the inverting input 314, the inverting output 322, and the non-inverting output 324, as shown in FIG. 3. In an embodiment in which transistors 316, 318 are field effect transistors (FETs) (e.g., metal-oxide semiconductor FETs (MOSFETs)) the gates of transistors 316, 318 are coupled to the non-inverting input 312 and the inverting input 314, respectively, and the drains of transistors 316, 318 are coupled with the first current source 326 and the second current source 328, respectively. The sources of transistors 316, 318 are coupled to the first current sink 330 and the second current sink 332, respectively, and also are coupled through source degeneration impedance circuit 320.

The source degeneration impedance circuit 320 is configured to control the gain-frequency response of the V-to-I converter 310. According to an embodiment, the source degeneration impedance circuit 320 includes a series inductor-capacitor (LC) resonant circuit 334, and a resistor (R) circuit 336, where the resistor circuit 336 is coupled in parallel with the series LC resonant circuit 334. At the resonant frequency of the source degeneration impedance circuit 320, the impedance of the LC resonant circuit 334 becomes very small (e.g., resembling a short circuit), and the transconductance of the V-to-I converter 310 is maximized (e.g., the gain of the V-to-I converter 310 is maximized).

FIG. 4 illustrates a simplified, circuit diagram of a source degeneration impedance circuit 400 (e.g., source degeneration impedance circuit 320, FIG. 3), according to an example embodiment. Circuit 400 includes a first inductor 404 (with a series parasitic resistance represented by resistor 402), a capacitor 406, and a second inductor 408 (with a series parasitic resistance represented by resistor 410), connected in series in the above-listed order. In addition, a resistor 412 is connected in parallel with the series-connected inductor 404, capacitor 406, and inductor 408.

In an embodiment, capacitor 406 is a variable capacitor (e.g., controllable via capacitance control signal 240, FIG. 2), although capacitor 406 may have a fixed capacitance, in an alternate embodiment. In addition, in an embodiment, resistor 412 is a variable resistor (e.g., controllable via resistance control signal 241, FIG. 2). In alternate embodiments, either or both capacitor 406 and resistor 412 may have a fixed capacitance or resistance, respectively. In still other alternate embodiments, either the first or second inductors 404, 408 may be excluded from the circuit.

FIG. 5 illustrates a simplified, circuit diagram of a source degeneration impedance circuit 500 (e.g., source degeneration impedance circuit 320, FIG. 3), according to another example embodiment. Circuit 500 includes a first capacitor 502, an inductor 506 (with a series parasitic resistance represented by resistor 504), and a second capacitor 508, connected in series in the above-listed order. In addition, a resistor 510 is connected in parallel with the series-connected capacitor 502, inductor 506, and capacitor 508.

In an embodiment, either or both of capacitors 502, 508 are a variable capacitor (e.g., controllable via capacitance control signal 240, FIG. 2), although one or both of capacitors 502, 508 may have a fixed capacitance, in alternate embodiments. In addition, in an embodiment, resistor 510 is a variable resistor (e.g., controllable via resistance control signal 241, FIG. 2). In alternate embodiments, either or both capacitors 502, 508 and/or resistor 510 may have a fixed capacitances or resistance, respectively. In still other alternate embodiments, inductor 506 may be excluded from the circuit.

Although two examples of source degeneration impedance circuits are illustrated in conjunction with FIGS. 4 and 5, above, it is to be understood that the circuit configurations provided in FIGS. 4 and 5 are provided for example purposes only, and that other embodiments may employ differently configured LC resonant circuits. In addition, although discrete capacitors, inductors, and resistors may be depicted in conjunction with FIGS. 4-6, each of the illustrated discrete components may be implemented with circuits of series and/or parallel connected components. Unlike conventional source degeneration circuits, the source degeneration impedance circuits discussed above in conjunction with FIGS. 4-5 each include one or more inductive components. In an alternate embodiment, source degeneration impedance circuit 320 may be replaced with a source degeneration circuit that does not include any inductive components.

Referring again to FIG. 3, and according to an embodiment, the capacitance of the LC resonant circuit 334 is adjustable (e.g., via capacitance control signal 240, FIG. 2), which enables the equalizer transfer function of the gain-frequency response to be tuned. Accordingly, the LC resonant circuit 334 may be tuned so that its resonant frequency corresponds with the bandwidth of the communication protocol being implemented by the system, at the time. According to an embodiment, the capacitance control signal (e.g., capacitance control signal 240, FIG. 2) is comprised of two bits, the values of which may correspond to four distinct capacitance values for the capacitance of the LC resonant circuit 334. In other embodiments, the capacitance control signal may include more or fewer bits, which may correspond to more or fewer distinct capacitance values.

The I-to-V converter stage 350 is configured to convert the differential current signal 342 produced by the V-to-I converter 310 into a differential output voltage signal 344. I-to-V converter 350 includes an inverting input 352, a non-inverting input 354, a first inverter comprising first and second transistors 356, 358 (e.g., a CMOS inverter), a second inverter comprising third and fourth transistors 360, 362 (e.g., also a CMOS inverter), first feedback impedance circuit 364, second feedback impedance circuit 366, a non-inverting output 370, an inverting output 372, and a tail current sink 374, in an embodiment.

The transistors 356, 358, 360, 362 of the first and second inverters are coupled between the inverting input 352, the non-inverting input 354, the non-inverting output 370, and the inverting output 372, as shown in FIG. 3. In an embodiment in which transistors 356, 358, 360, 362 are MOSFETs, the gates of transistors 356, 358 are coupled to the inverting input 352, and the gates of transistors 360, 362 are coupled to the non-inverting input 354. The drains of transistors 356, 360 are coupled with the source voltage 338, and the drains of transistors 358, 362 are coupled with tail current sink 374. The sources of transistors 356, 358 are coupled together and to the non-inverting output 370, and the sources of transistors 360, 362 are coupled together and to the inverting output 372.

Tail current sink 374 provides a bias current for both coupled inverters and the related feedback circuits (e.g. transistors 356, 358, 360, and 362, and circuits 364 and 366), in order to support differential circuit operations for higher switching speeds. Tail current sink 374 also may enhance the noise immunity capacity against power supply noise (e.g., noise from source voltage 338 or ground) and the input common-mode noise (e.g., common-mode noise at both inputs 352 and 354).

First feedback impedance circuit 364 is coupled across the gates and sources of transistors 356, 358, and thus between the inverting input 352 and the non-inverting output 370. Similarly, second feedback impedance circuit 366 is coupled across the gates and sources of transistors 360, 362, and thus between the non-inverting input 354 and the inverting output 372. The first and second feedback impedance circuits 364, 366 are configured to enhance the gain and bandwidth performance of primary equalizer 300. According to an embodiment, each of feedback impedance circuits 364, 366 includes an impedance (Z) circuit 380, 382 coupled in series with a resistor (R) circuit 386, 388. The impedance circuits 380, 382 may include an inductance circuit, a capacitance circuit, or a combined LC circuit, in various embodiments. For example, the impedance circuits 380, 382 each may include a parallel connected inductor circuit and capacitor circuit, connected in series with a resistor circuit, as will be described in conjunction with FIG. 6. In an alternate embodiment, each of the impedance circuits 380, 382 may include an inductor circuit in series with a resistor circuit (i.e., without a capacitor circuit). In another alternate embodiment, the impedance circuits 380, 382 may be replaced with a resistor circuit.

FIG. 6 illustrates a simplified, circuit diagram of a feedback impedance circuit 600 (e.g., either or both of feedback impedance circuits 364, 366, FIG. 3), according to an example embodiment. Circuit 600 includes an inductor 602 (with a series parasitic resistance represented by resistor 604) connected in parallel with a capacitor 606, and a resistor 608 connected in series with the parallel-connected inductor 602 and capacitor 606. In an embodiment, resistor 608 is a variable resistor (e.g., controllable via resistance control signal 242, FIG. 2), and capacitor 606 is a variable capacitor (e.g., controllable via capacitance control signal 243, FIG. 2). In alternate embodiments, either or both capacitor 606 and resistor 608 may have a fixed capacitance or resistance, respectively.

Referring again to FIG. 3, at the resonant frequency of the first and second impedance circuits 380, 382, the impedances of the impedance circuits 380, 382 become very large (e.g., resembling an open circuit), and the transimpedance of the I-to-V converter 350 is maximized (e.g., the gain of the I-to-V converter 350 is maximized). In other words, at the resonant frequency, the extra impedance provided by impedance circuits 380, 382 will boost up the overall AC gain of the equalizer 300.

According to an embodiment, the resistances of the resistor circuits 386, 388 are adjustable (e.g., via resistance control signal 242, FIG. 2). In addition, in embodiments in which the impedance circuits 380, 382 include capacitors, the capacitors also may be adjustable (e.g., via capacitance control signal 243, FIG. 2). The adjustability of the resistor and impedance circuits 380, 382, 386, 388, once again, enables the equalizer transfer function of the gain-frequency response to be further tuned. Similar to LC circuit 334, the impedance circuits 380, 382 may be tuned so that their resonant frequencies correspond with the bandwidth of the communication protocol being implemented by the system, at the time. According to an embodiment, the capacitance control signal (e.g., capacitance control signal 243, FIG. 2) is comprised of two bits, the values of which may correspond to four distinct capacitance values for the capacitance of the impedance circuits 380, 382. The resistance control signal (e.g., resistance control signal 242, FIG. 2) is comprised of four bits, the values of which may correspond to sixteen distinct resistance values for the resistance of the resistor circuits 386, 388. In other embodiments, the capacitance and/or resistance control signals may include more or fewer bits, which may correspond to more or fewer distinct capacitance and resistance values.

By including resonant circuits in equalizer 300, the equalizer's gain-frequency transfer function may be "shaped" to match the communication channel's gain (loss) transfer characteristic. In addition, the peak gain may be set to a desired frequency, and minimum gains at lower frequencies may be defined. For example, in the V-to-I converter 310, with a large value for resistor circuit 336, the total degeneration-impedance becomes a minimum at the resonant frequency of the LC resonant circuit 334. This enables the V-to-I converter 310 to generate a desired gain-frequency transfer function for the I-to-V converter 350. In the I-to-V converter 350, the peak gain may be set to a desired frequency based on the capacitance of the feedback impedance circuits 364, 366, and the resistance of the feedback impedance circuits 364, 366 may be controlled to define the minimum gain at lower frequencies.

Figure 7:
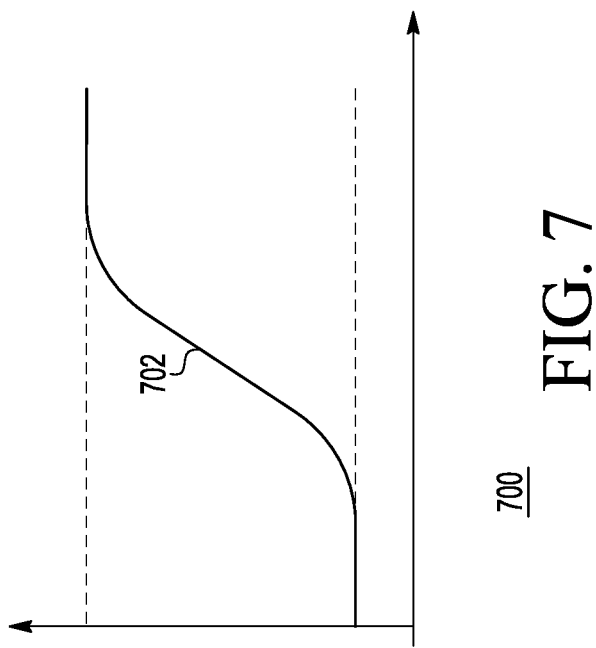
FIG. 7 illustrates a graph of a transconductance-frequency transfer function for an equalizer with a source degeneration circuit that includes a non-zero resistance and a non-zero capacitance, in accordance with the prior art.

FIG. 7 illustrates a graph 700 of a transconductance-frequency transfer function 702 for an equalizer with a source degeneration circuit that includes a non-zero resistance and a non-zero capacitance (i.e., the source degeneration circuit does not include an inductance circuit), in accordance with the prior art. In graph 700, frequency is represented along the horizontal axis, and transconductances represented along the vertical axis. As the transfer function 702 shows, the non-zero resistance attenuates an input signal at relatively low frequencies, and the non-zero capacitance allows the signal to be passed through the equalizer at relatively high frequencies.

Figure 8:
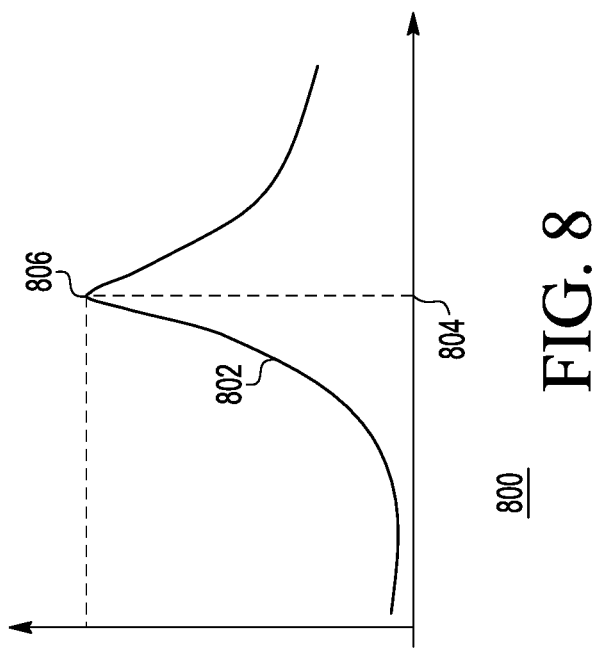
FIG. 8 illustrates a graph of a transconductance-frequency transfer function for an equalizer with a source degeneration circuit that includes an LC resonant circuit, according to an example embodiment.

FIG. 8 illustrates a graph 800 of a transconductance-frequency transfer function 802 for an equalizer with a source degeneration circuit (e.g., source degeneration circuit 320, FIG. 3) that includes an LC resonant circuit (e.g., LC resonant circuit 334, FIG. 3), according to an example embodiment. In graph 800, frequency is represented along the horizontal axis, and transconductances represented along the vertical axis. As the transfer function 802 shows, the inductance present in the LC resonant circuit causes a transfer function in which the transconductance remains the same as that of the differential pair (e.g., transistors 316 and 318) without source degeneration reduction at the resonant frequency 804 of the LC resonant circuit, which results in a peak 806 in the transfer function at the resonant frequency 804. On either side of the peak 806, the gain is attenuated.

Thus, various embodiments of differential equalizers with source degeneration and feedback circuits have been described above. An embodiment of an equalizer includes a voltage-to-current converter and a current-to-voltage converter. The voltage-to-current converter is configured to convert a differential input voltage to a differential current, and includes a differential amplifier having a first transistor and a second transistor, and a first source degeneration circuit coupled between the first transistor and the second transistor. The first source degeneration circuit includes a first resonant circuit. The current-to-voltage converter is coupled to the voltage-to-current converter, and is configured to convert the differential current to a differential output voltage. The current-to-voltage converter includes a first inverter with a first feedback circuit and a second inverter coupled to the first inverter, which includes a second feedback circuit. The first feedback circuit includes a second resonant circuit, and the second feedback circuit includes a third resonant circuit.

Another embodiment of an equalizer also includes a voltage-to-current converter and a current-to-voltage converter. The voltage-to-current converter is configured to convert a differential input voltage to a differential current, and includes a differential amplifier having a first transistor and a second transistor, and a first source degeneration circuit coupled between the first transistor and the second transistor. The first source degeneration circuit includes a first resonant circuit. The current-to-voltage converter is coupled to the voltage-to-current converter, and is configured to convert the differential current to a differential output voltage. The current-to-voltage converter includes a first inverter with a first feedback circuit, and a second inverter coupled to the first inverter, which includes a second feedback circuit.

Yet another embodiment of an equalizer also includes a voltage-to-current converter and a current-to-voltage converter. The voltage-to-current converter is configured to convert a differential input voltage to a differential current, and includes a differential amplifier having a first transistor and a second transistor, and a first source degeneration circuit coupled between the first transistor and the second transistor. The current-to-voltage converter is coupled to the voltage-to-current converter, and is configured to convert the differential current to a differential output voltage. The current-to-voltage converter includes a first inverter with a first feedback circuit, and a second inverter coupled to the first inverter with a second feedback circuit. The first feedback circuit includes a first resonant circuit, and the second feedback circuit includes a second resonant circuit.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An equalizer comprising:
    a voltage-to-current converter configured to convert a differential input voltage to a differential current, the voltage-to-current converter comprising:
    a differential amplifier having a first transistor and a second transistor, and
    a first source degeneration circuit coupled between the first transistor and the second transistor, wherein the first source degeneration circuit includes a first resonant circuit; and
    a current-to-voltage converter coupled to the voltage-to-current converter, wherein the current-to-voltage converter is configured to convert the differential current to a differential output voltage, the current-to-voltage converter comprising:
    a first inverter with a first feedback circuit, wherein the first feedback circuit includes a second resonant circuit, and
    a second inverter coupled to the first inverter, wherein the second inverter includes a second feedback circuit having a third resonant circuit.

2. The equalizer of claim 1, wherein the first source degeneration circuit comprises:
    a resistor circuit coupled in parallel with the first resonant circuit,
    wherein the first resonant circuit comprises a capacitor circuit coupled in series with an inductor circuit.

3. The equalizer of claim 2, wherein the resistor circuit comprises a variable resistor circuit.

4. The equalizer of claim 2, wherein the capacitor circuit comprises a variable capacitor circuit.

5. The equalizer of claim 1, wherein the first transistor is a field effect transistor (FET) with a first source, a first gate, and a first drain, and the second transistor is a FET with a second source, a second gate, and a second drain, and the first source degeneration circuit is coupled between the first source and the second source.

6. The equalizer of claim 1, wherein:
    the first feedback circuit comprises
        a first resistor circuit coupled in series with the second resonant circuit,
        wherein the second resonant circuit comprises a first capacitor circuit coupled in parallel with a first inductor circuit; and
    the second feedback circuit comprises
        a second resistor circuit coupled in series with the third resonant circuit,
        wherein the third resonant circuit comprises a second capacitor circuit coupled in parallel with a second inductor circuit.

7. The equalizer of claim 6, wherein the first resistor circuit comprises a first variable resistor circuit, and the second resistor circuit comprises a second variable resistor circuit.

8. The equalizer of claim 6, wherein the first capacitor circuit comprises a first variable capacitor circuit, and the second capacitor circuit comprises a second variable capacitor circuit.

9. The equalizer of claim 1, wherein the voltage-to-current converter and the current-to-voltage converter form portions of a primary equalizer, and the equalizer further comprises:
    a secondary equalizer coupled in series with the primary equalizer, wherein the secondary equalizer comprises an additional voltage-to-current converter coupled in series with an additional current-to-voltage converter; and
    control circuitry configured to determine whether an over-equalization condition or an under-equalization condition is present, wherein the control circuitry is further configured to cause the secondary equalizer to function as a limiter circuit when the over-equalization condition is present and to cause the secondary equalizer to function as an extended equalizer stage when the under-equalization condition is present.

10. The equalizer of claim 1, wherein the voltage-to-current converter further comprises a pair of current sources.

11. The equalizer of claim 1, wherein the voltage-to-current converter further comprises a current mirror circuit.

12. The equalizer of claim 1, wherein the current-to-voltage converter further comprises a current sink coupled to the first inverter and the second inverter.

13. The equalizer of claim 12, wherein:
    the first inverter comprises a first field effect transistor (FET) having a first source, a first gate, and a first drain, and a second FET having a second source, a second gate, and a second drain, wherein the first source and the second source are coupled together, to an inverting output, and to the first feedback circuit;
    the second inverter comprises a third FET having a third source, a third gate, and a third drain, and a fourth FET having a fourth source, a fourth gate, and a fourth drain, wherein the third source and the fourth source are coupled together, to a non-inverting output, and to the second feedback circuit; and wherein the current sink is coupled to the second drain of the first inverter and to the fourth drain of the second inverter.

14. An equalizer comprising:
a voltage-to-current converter configured to convert a differential input voltage to a differential current, the voltage-to-current converter comprising:
a differential amplifier having a first transistor and a second transistor, and
a first source degeneration circuit coupled between the first transistor and the second transistor, wherein the first source degeneration circuit includes a first resonant circuit; and
a current-to-voltage converter coupled to the voltage-to-current converter, wherein the current-to-voltage converter is configured to convert the differential current to a differential output voltage, the current-to-voltage converter comprising
a first inverter, and
a second inverter coupled to the first inverter.

15. The equalizer of claim 14, wherein the first source degeneration circuit comprises:
a resistor circuit coupled in parallel with the first resonant circuit,
wherein the first resonant circuit comprises a capacitor circuit coupled in series with an inductor circuit.

16. The equalizer of claim 14, wherein:
the first inverter includes a first feedback circuit with a second resonant circuit; and
the second inverter includes a second feedback circuit with a third resonant circuit.

17. The equalizer of claim 14, wherein the current-to-voltage converter further comprises a current sink coupled to the first inverter and the second inverter.

18. The equalizer of claim 14, wherein the voltage-to-current converter and the current-to-voltage converter form portions of a primary equalizer, and the equalizer further comprises:
a secondary equalizer coupled in series with the primary equalizer, wherein the secondary equalizer comprises an additional voltage-to-current converter coupled in series with an additional current-to-voltage converter; and
control circuitry configured to determine whether an over-equalization condition or an under-equalization condition is present, wherein the control circuitry is further configured to cause the secondary equalizer to function as a limiter circuit when the over-equalization condition is present and to cause the secondary equalizer to function as an extended equalizer stage when the under-equalization condition is present.

19. An equalizer comprising:
a voltage-to-current converter configured to convert a differential input voltage to a differential current, the voltage-to-current converter comprising:
a differential amplifier having a first transistor and a second transistor, and
a first source degeneration circuit coupled between the first transistor and the second transistor; and
a current-to-voltage converter coupled to the voltage-to-current converter, wherein the current-to-voltage converter is configured to convert the differential current to a differential output voltage, the current-to-voltage converter comprising
a first inverter with a first feedback circuit, wherein the first feedback circuit includes a first resonant circuit, and
a second inverter coupled to the first inverter, wherein the second inverter includes a second feedback circuit having a second resonant circuit.

20. The equalizer of claim 19, wherein the first source degeneration circuit includes a third resonant circuit.

21. The equalizer of claim 19, wherein:
the first feedback circuit comprises
a first resistor circuit coupled in series with the first resonant circuit,
wherein the first resonant circuit comprises a first capacitor circuit coupled in parallel with a first inductor circuit; and
the second feedback circuit comprises
a second resistor circuit coupled in series with the second resonant circuit,
wherein the second resonant circuit comprises a second capacitor circuit coupled in parallel with a second inductor circuit.

22. The equalizer of claim 19, wherein the voltage-to-current converter and the current-to-voltage converter form portions of a primary equalizer, and the equalizer further comprises:
a secondary equalizer coupled in series with the primary equalizer, wherein the secondary equalizer comprises an additional voltage-to-current converter coupled in series with an additional current-to-voltage converter; and
control circuitry configured to determine whether an over-equalization condition or an under-equalization condition is present, wherein the control circuitry is further configured to cause the secondary equalizer to function as a limiter circuit when the over-equalization condition is present and to cause the secondary equalizer to function as an extended equalizer stage when the under-equalization condition is present.

\* \* \* \* \*